United States Patent [19]

Brune et al.

[11] Patent Number: 5,229,615
[45] Date of Patent: Jul. 20, 1993

[54] END STATION FOR A PARALLEL BEAM ION IMPLANTER

[75] Inventors: Robert A. Brune; Dorsey T. Smith; Andrew M. Ray, all of Austin, Tex.

[73] Assignee: Eaton Corporation, Cleveland, Ohio

[21] Appl. No.: 847,766

[22] Filed: Mar. 5, 1992

[51] Int. Cl.[5] .............................................. H01J 37/20
[52] U.S. Cl. ............................. 250/492.2; 250/442.11; 250/398
[58] Field of Search ............... 250/492.21, 492.2, 398, 250/442.1

[56] References Cited

U.S. PATENT DOCUMENTS

| | | | |
|---|---|---|---|
| 3,778,626 | 12/1973 | Robertson | 250/492.21 |
| 4,745,287 | 5/1988 | Turner | 250/492.21 |
| 4,975,586 | 12/1991 | Ray | 250/492.2 |
| 5,003,183 | 3/1991 | Nogami et al. | 250/492.2 |
| 5,046,992 | 9/1991 | Tamai et al. | 474/84 |
| 5,052,884 | 10/1991 | Igari | 414/744.2 |

FOREIGN PATENT DOCUMENTS 2199758 8/1990 Japan.

Primary Examiner—Jack I. Berman
Attorney, Agent, or Firm—F. M. Sajovec

[57] ABSTRACT

An end station for an ion implanter includes a loading station, a loadlock station, a vacuum chamber and a wafer handler within the vacuum chamber. The wafer handler includes a wafer-receiving platen assembly on the end of a multiple axis arm system wherein the arm system is capable of positioning the wafer for low and high angle of incidence implantation, rotating the wafer about an axis perpendicular to the wafer surface, and effecting scanning motion of the wafer along a straight line which intercepts the wafer tilt axis in any tilt position of the platen assembly. The invention further includes a loadlock including an upper element receiving wafers from the loading station and a lower element operable to position wafers for engagement by a transfer arm which transfers wafers from the loadlock to the wafer handler.

10 Claims, 4 Drawing Sheets

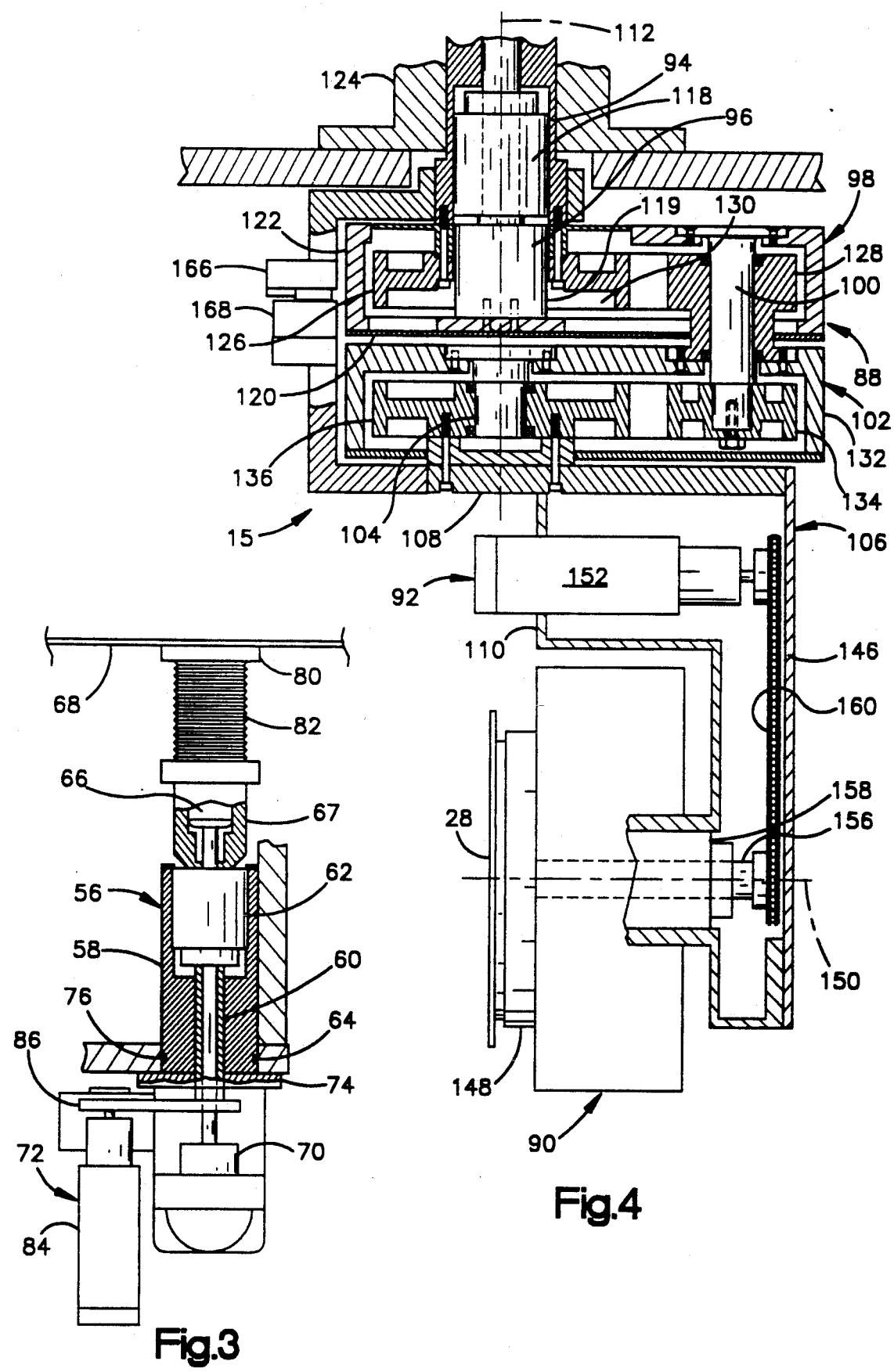

END STATION FOR A PARALLEL BEAM ION IMPLANTER

The present invention relates generally to ion implantation equipment and more particularly to an improved end station for an ion implanter.

As the size of semiconductor wafers has increased from 4" diameter to 6" and then to 8", the need has developed to provide scanning systems which are capable of producing an ion beam which strikes the wafer perpendicular to the wafer surface at all points across the width of the beam and wherein the beam extends across the full diameter of the wafer, thus requiring additional scanning in a direction perpendicular to the initial scanned direction of the beam.

At the same time, there is a need to implant wafers at widely variable implant angles, and to rotate the wafers during implantation.

In addition to the above, there is a continual effort to improve the throughput of wafer processing systems, while at the same time minimizing particulate contamination during processing.

In the prior art, there are a number of end stations which are particularly adapted for parallel beam scanning and/or for high tilt angle implantation and wafer rotation. Examples include U.S. Pat. No. 4,975,586 to Ray, and assigned to the assignee of this application, and U.S. Pat. No. 5,003,183 to Nogami, et al.

While the above have satisfied certain of the above needs, it is an object of the present invention to provide an improved end station including a wafer loading and unloading station, a load lock between the wafer loading station and the vacuum chamber, and a wafer handling system within the vacuum chamber.

Other objects and advantages of the present invention will be apparent from the following description when considered in connection with the following drawings, wherein:

FIG. 3 is an enlarged elevation view of the wafer transfer arm assembly shown partly in section;

FIG. 4 is an enlarged sectional view of the wafer handler of the invention;

Figure 1:
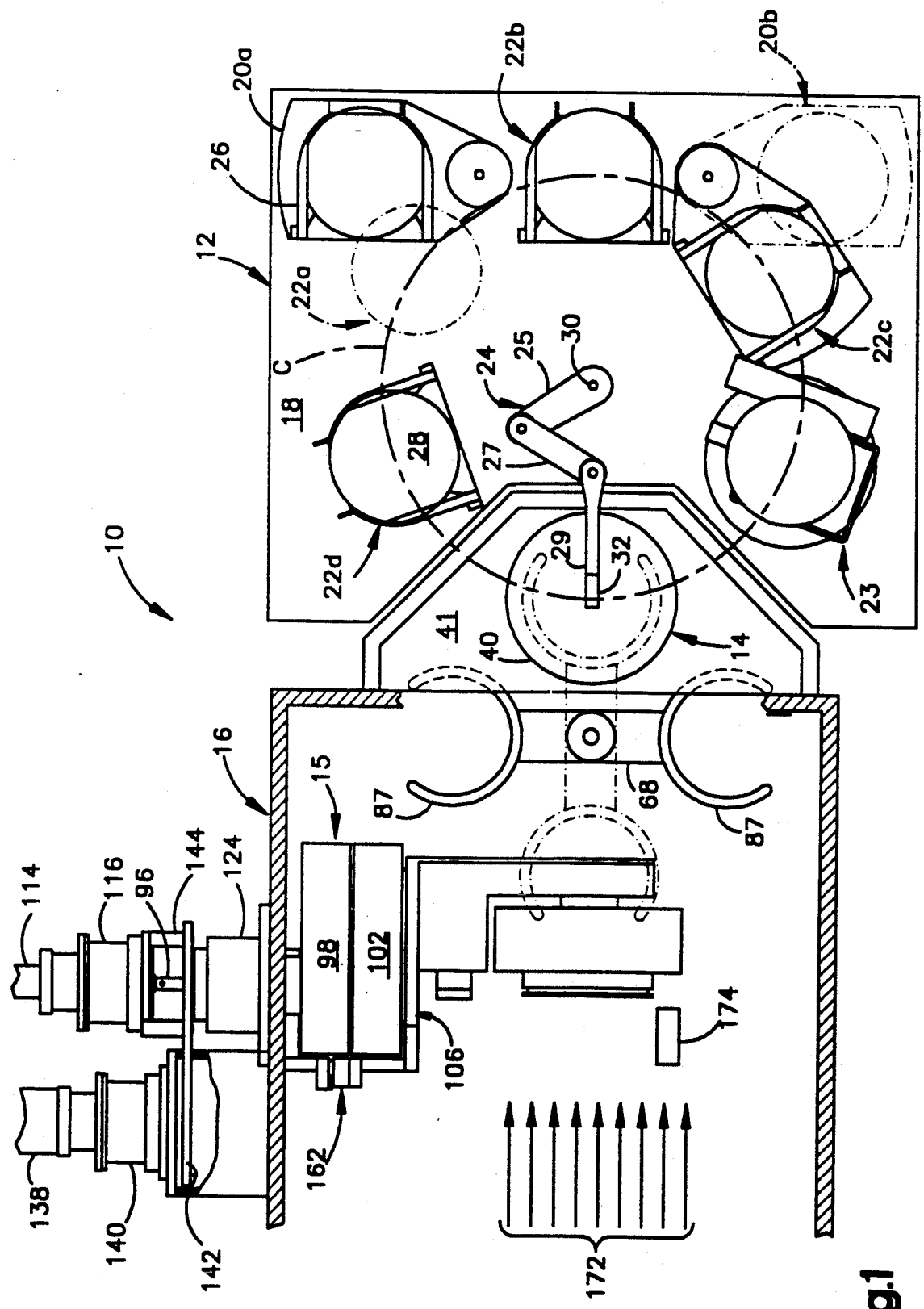
FIG. 1 is a plan view of the present invention with parts removed for clarity.

Referring to FIG. 1, the end station of the invention designated generally by the numeral 10, comprises a wafer loading station 12, a loadlock station 14, and a wafer handler 15 located within a vacuum chamber 16.

LOADING STATION

The loading station 12 operates in atmosphere and comprises a platform 18, first and second rotatable cassette receiving stations 20a and 20b mounted on the platform; a plurality of cassette stations 22a, 22b, 22c and 22d arranged in a circular pattern C on the platform; a wafer orienter 23 located on the cassette circle; and a robotic wafer handler 24 on the axis of the circle.

The rotatable cassette receiving station 20a is shown in full line in position to be loaded from an external source. Cassette receiving station 20b is shown in full line rotated in position to place a cassette 26 on the circle C. It can be seen that cassette receiving station 20a is capable of receiving a cassette at the front of the loading station and transferring it to cassette station 22a and that receiving station 20b is capable of receiving a cassette and transferring it to cassette station 22c. Cassette station 22d is a buffer station in which the cassette is manually positioned. The rotatable receiving stations can be selected from a number of commercially available mechanisms which are not part of the present invention. The wafer orienter 23 is also located on the circle C to put the wafers in the proper angular orientation for implanting as is well known in the art.

Wafers 28 are transferred from a cassette station 22 to the orienter 23 and from the orienter into the loadlock station 14 by means of the robot wafer handler 24, which can be of the type described in U.S. Pat. No. 5,046,992, which is incorporated herein by reference. The robot 24 is located on the axis 30 of the circle C and comprises a first arm 25, a second arm 27 pivotally connected to the first and a third arm 29 pivotally connected to the second, with the end of the third arm including a wafer retainer 32. As described in detail in U.S. Pat. No. 5,046,992, the robot 24 is capable of rotating about axis 30 into alignment with the cassettes and with the orienter and the arms are interconnected in a manner which permits the wafer retainer element to move radially for pickup and deposit of the wafers while maintaining a desired angular orientation of the wafer. The robot is also movable from the position shown in FIG. 2 to raised positions aligned with other wafers in a cassette and with the loadlock station.

In operation, wafers are transferred by the robot 24 from any one of the cassettes 26 to the wafer orienter where the desired orientation is effected, after which the wafer is removed from the orienter and transferred to the loadlock station 14, which is also centered on the circle C.

LOADLOCK

Figure 2:
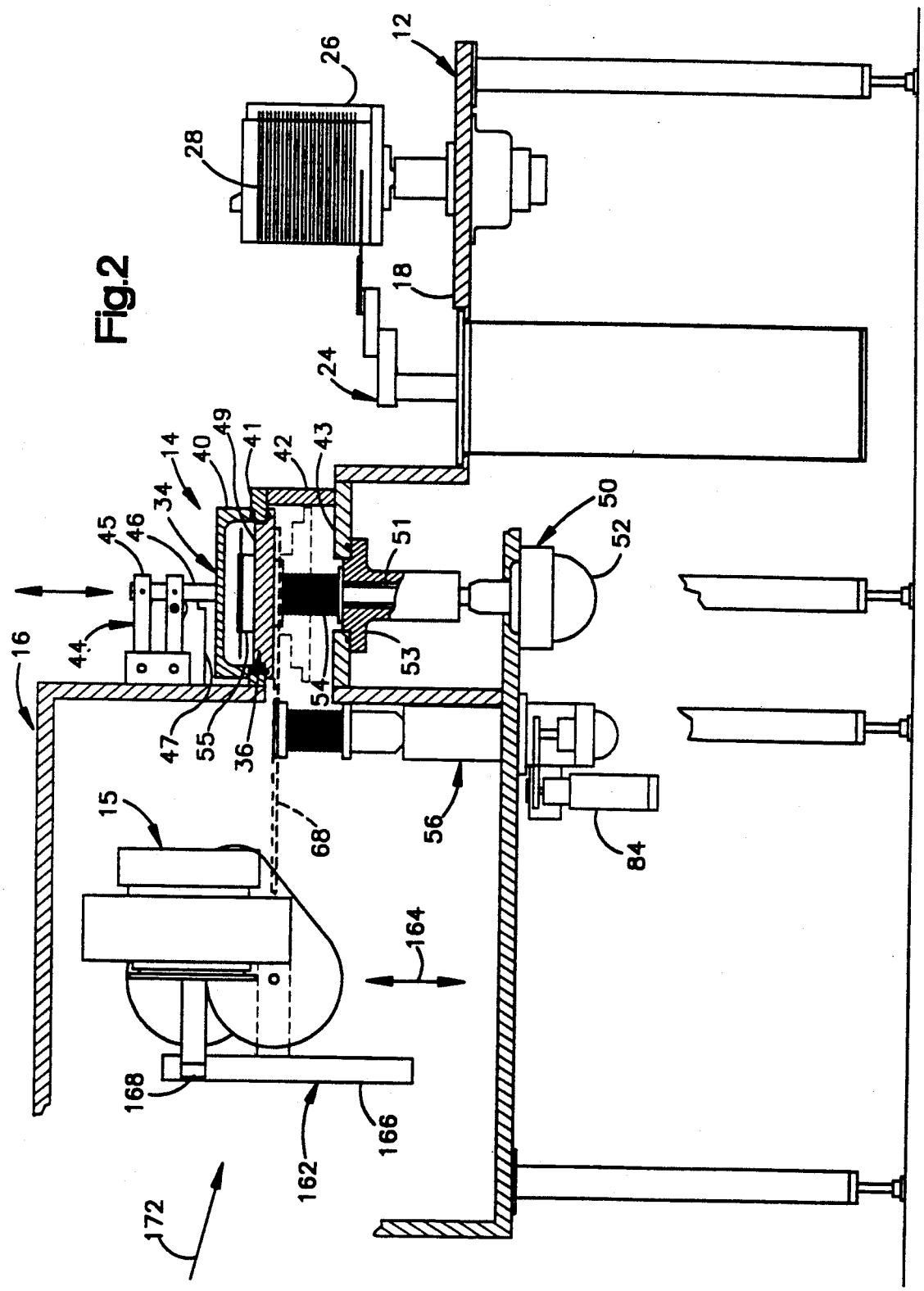
FIG. 2 is an elevation view of the invention with parts removed.

Referring particularly to FIG. 2, the loadlock 14 comprises an upper loadlock assembly 34 and a lower loadlock assembly 36, and is positioned to receive wafers transferred from the loading station 12 by the robot arm 24. The upper loadlock comprises a dish-shaped member 40 sealingly engaged with the top surface of a cover plate 41 which, along with wall 42 and plate 43 defines an extension of the vacuum chamber 16; and a vertical drive mechanism 44 which is operable to move the member 40 vertically to disengage it from the plate 41 to permit the robot arm to enter the loadlock station for insertion of a wafer 28. The vertical drive mechanism 44 can be one of many known mechanisms for providing parallel motion, but is illustrated herein as a parallelogram link system 45 pivotally mounted on the outside of the vacuum chamber and to a rod 46 fixed to the member 40 and driven by a rotary actuator 47 to ensure precise vertical movement of the member 40.

The lower loadlock assembly 36 comprises a cylindrical valve plate 49 concentric with the member 40 and sealingly engageable with the bottom surface of the cover plate 41, and a vertical drive assembly 50. The drive assembly comprises an actuating rod 51 connected at one end to the valve plate 49 and at the other end to a rotary-to-linear drive mechanism 52. The rod 51 is supported and aligned by means of a linear bearing assembly 53 which is sealingly attached to the plate 43. Since the rod 51 penetrates the vacuum chamber, a metallic bellows 54 surrounds the rod and is sealingly attached to the bottom of the valve plate 49 and to the bearing assembly 53.

The valve plate 49 has a wafer-receiving platen 55 fixed thereon, and is movable between a first position as shown in full line FIG. 2 wherein the valve plate 49 is sealingly engaged with the plate 41 and the platen 55 is in position to transfer wafers to or from the robot 24 when the upper loadlock is open, and a second position shown in broken line wherein the platen 55 is lowered into the vacuum chamber in position for the transfer of wafers between the platen and a wafer transfer arm assembly 56 operable to transfer wafers from the loadlock to the wafer handler 15.

WAFER TRANSFER ARM ASSEMBLY

Referring particularly to FIG. 3, the wafer transfer arm assembly 56 comprises a housing 58 protruding through and fixed to the vacuum chamber, an outer shaft 60 extending through a Ferrofluidic vacuum rotary feedthrough 62 received within the housing, an inner shaft 64 supported for linear motion relative to the outer shaft by a ball spline assembly 66 which is housed within a housing 67 fixed to the outer shaft and which couples the outer shaft to the inner shaft, a transfer arm 68 attached to the inner shaft, a linear drive mechanism 70 connected to the inner shaft 64, and a rotary drive mechanism 72 connected to the outer shaft.

The housing 58 is a cylindrical member fixed to the vacuum chamber wall by means of a flange 74 and sealed thereto by an 0-ring 76.

The inner shaft 64 is supported for linear motion by the ball spline assembly and is attached at its upper end to a hub member 80 fixed to the transfer arm 68. A bellows 82 is received between the hub 80 and the housing 67 to maintain the vacuum integrity of the end station. The linear drive mechanism 70 can be one of a number of available mechanisms capable of imparting linear motion to the shaft 64, and will not be described herein in detail. The rotary drive mechanism 72 as illustrated herein comprises a servo motor 84 mounted on the outside of the vacuum chamber and a toothed belt and pulley system 86 operating on the outer shaft 60.

Referring to FIG. 1, a ring-like wafer receiving member 87 is formed at either end of the transfer arm 68.

In the solid line position of FIG. 1, the transfer arm 68 is in an inactive position, such as during implantation of a wafer. When a wafer i to be transferred from the loadlock station 14 to the wafer handler 15, the transfer arm is rotated to the broken line position of FIG. 1 and put in a down position as shown in FIG. 2. At this time, the lower loadlock assembly will be in its down position shown in broken line in FIG. 2. The transfer arm is then raised slightly to pick the wafer off the loadlock platen 55 and then rotated 180 degrees to place the receiving member 87 in position to deposit a wafer on the wafer handler 15 for implantation. It will be understood that during this rotation, an implanted wafer on the opposite end of the transfer arm will be simultaneously transferred to the lower loadlock assembly for transport back to the loading station.

WAFER HANDLER

The wafer handler 15 comprises a three-axis arm assembly 88, a wafer receiving platen assembly 90 mounted on the outer element of the arm assembly, and a rotary drive system 92 mounted on the outer element and operable to rotate the platen about its axis.

Referring particularly to FIG. 4, the arm assembly comprises a hollow outer shaft 94, an inner shaft 96 supported for rotation within the outer shift, a first arm assembly 98 fixed to the inner shaft, a first axle 100 fixed to the outer end of the first arm, a second arm assembly 102 mounted for rotation about the axle 100, a second axle 104 fixed to the outer end of the second arm assembly 102, and a third arm assembly 106 mounted for rotation about the second axle.

The third arm assembly 106 comprises a plate 108, a housing 110 fixed to the plate and extending parallel to the first and second shafts, the platen assembly 90 mounted for rotation on the housing 110, a platen 148 mounted on the platen assembly, and the drive system 92 mounted on the housing and operable to rotate the platen assembly 90 about its axis.

Referring particularly to FIGS. 1 and 4, the drive elements of the wafer handler are shown in detail. The 10 drive system, which is capable of rotating the entire wafer handler assembly about axis 112 and of moving the platen assembly 90 linearly in any angular position of the handler assembly, is well known in the art as shown in U.S. Pat. No. 5,046,992 and only the basic elements thereof will be described in detail herein. The inner shaft 96 is driven by a first servo motor 114 through a harmonic reduction system 116. The shaft 96 extends through a Ferrofluidic seal assembly 118, and is fixed to a housing 122 which encloses the first arm assembly 98. The outer shaft 94 extends through a Ferrofluidic seal 124 and is fixed to a first pulley 126. A second pulley 128 is mounted for rotation on the first axle 100, which is fixed to the housing 122. The first and second pulleys are linked by a stainless steel belt 130 which is fixed to both pulleys.

The second pulley 128 is fixed to a housing 132 which encloses the second arm assembly 102, while the first axle 100 is fixed to a third pulley 134 within the second arm. A fourth pulley is fixed to the third arm 106 of the wafer handler and is mounted for rotation on the second axle 104 which is fixed to the housing 132. The third and fourth pulleys are linked by a stainless steel belt 133 fixed to both pulleys. Rotation of the inner shaft 96 by the servo motor causes linear motion of the third arm assembly 106 (and thus the wafer 28) along a line perpendicular to the axis 112.

The outer shaft 94 is driven by a second servo motor 138 through a harmonic reduction system 140 and a chain drive system 142 which drives a sprocket fixed to a housing 144 which supports the first servo motor 114. When the outer shaft 94 is driven by the second motor, the inner shaft also rotates; therefore, the entire arm assembly 88 rotates about axis 112 with no change in the relative positions among the first, second and third arms.

The third arm assembly comprises the plate 108, housing 110 and a cover plate 146 both fastened to the housing, and platen assembly 90 also mounted on the housing. The platen assembly, shown somewhat schematically herein, comprises a platen 148 mounted for rotation about an axis 150 perpendicular to the surface of the wafer. The rotary drive 92 comprises a motor 152 mounted on the housing 110, a platen drive shaft 156 fixed to the platen 148 and mounted for rotation within a Ferrofluidic seal assembly 158 received between the shaft and the housing, and a chain drive system 160 linking the drive shaft 156 and the output shaft of the motor 152.

Figures 5A, 5B:
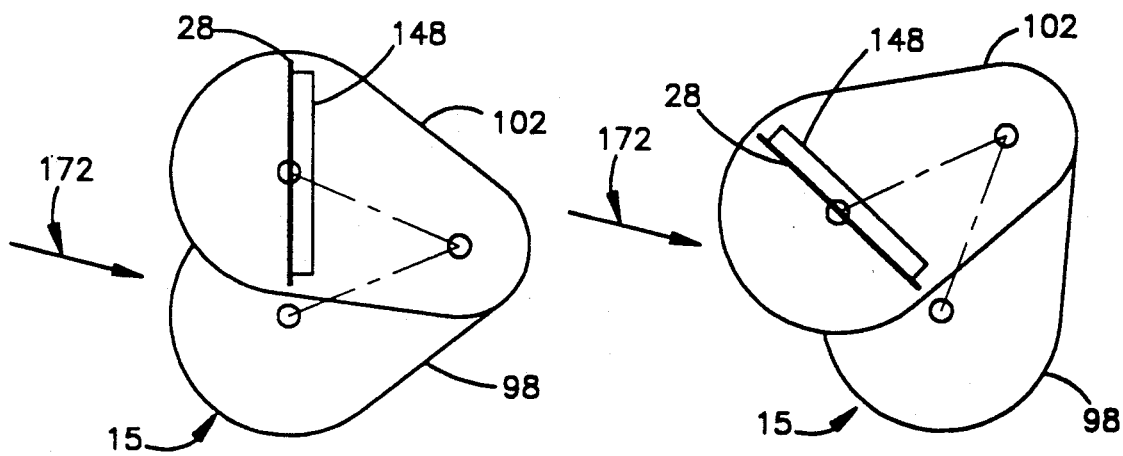
FIGS. 5A, 5B, 5C and 5D are schematic views showing typical positions of the wafer handler arms and wafer holder of the invention.
Figures 5C, 5D:
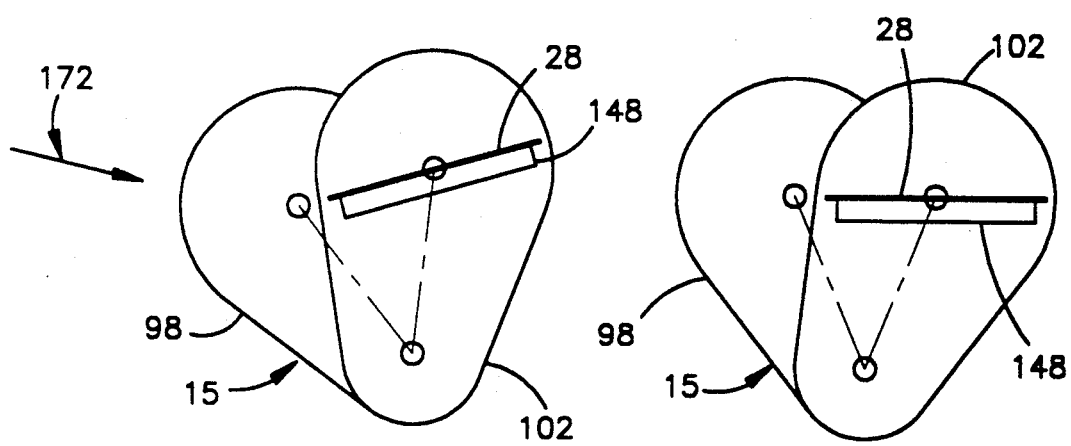

FIG. 5A depicts the position of a wafer 28 as illustrated in FIG. 2 wherein the wafer is at a relatively small tilt angle from perpendicular to an ion beam 172. FIG. 5B depicts a position wherein the entire wafer handler 15 is rotated to a position suitable for high angle implantation in one direction, FIG. 5C depicts a position for high angle implantation in an opposite direction. FIG. 5D depicts the wafer handler in position for wafers to be deposited onto or removed from the platen 148 by the transfer arm assembly 56. It should be noted that the plane surface of the wafer 28 being implanted always intercepts the axis 112 and the centerline of the ion beam 172 in all translation and tilt positions.

Referring to FIGS. 2 and 4, in accordance with another aspect of the invention, a linear encoder 162 is mounted on the wafer handler to provide a signal proportional to the position of the wafer relative to a baseline in the mechanical scanning direction indicated by the arrow 164 in FIG. 2. This system includes a scale element 166 fixed to the outer shaft 94 of the wafer handler; and a sensor 168 fixed to the third arm assembly 106 and movable along the scale. In the preferred embodiment, the encoder employed is a LIDA Model 201, manufactured by Herdenhain Corporation.

Figure 6:
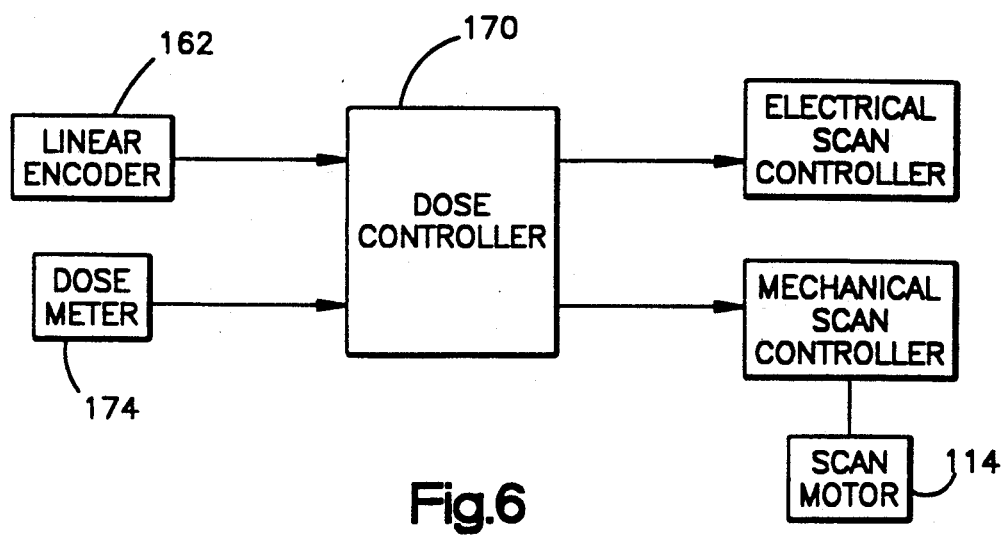
FIG. 6 is a schematic block diagram of a dose control system of the invention.

Referring to FIGS. 1 and 6, the linear encoder is used in a dose control system wherein the scan motor is controlled by a dose controller 170 which receives inputs from the linear encoder 162 and from a dose meter 174 which is located in front of the wafer and adjacent the edge thereof. Since the wafer position in the mechanical scan direction is detected directly rather than inferentially from rotary encoders in the scan drive system, the system can provide a more accurate position signal than heretofore possible.

OPERATION

Cassette loads of wafers are deposited directly on cassette station 22b and on the cassette receivers 20a and 20b for transfer to the cassette stations 22a and 22c. A wafer to be implanted is selected from one of the cassette stations and transferred by the robotic handler 24 to the wafer orienter 23. At this point, the lower loadlock assembly 36 is in its upper or closed position as shown in FIG. 2 and the upper loadlock assembly 34 is opened. The robot 24 then transfers a wafer from the orienter and deposits it on the platen 55 of the lower loadlock assembly, after which the upper loadlock assembly is closed and pumped down. The lower loadlock is then opened by moving it to its down position and the wafer transfer arm 68 is rotated to the broken line position of FIG. 2 to pick up the wafer. The wafer arm is then rotated 180 degrees to put it into position to deposit the wafer onto the platen 148 of the wafer handler 15, which has been put into the position depicted in FIG. 5C. The wafer handler 15 is then rotated to positions such as those depicted in FIGS. 5A-5C for implantation.

During implantation, a parallel ribbon beam 172 is generated in one axis (by means not shown) and the scan motor 114 is energized to provide scanning of the wafer in an orthogonal axis. If the implantation process being performed requires it, the wafer 2B can be rotated about an axis perpendicular to its surface by the rotary drive system 92.

During continuous implantation operations, i can be appreciated that a wafer which has been implanted is transferred back to the loading station essentially simultaneously with the transfer operations described above.

We claim:

1. In an end station for an ion implanter comprising a vacuum chamber; and a wafer handler within said vacuum chamber; the improvement wherein said wafer handler comprises a first wafer support; means for rotating said first wafer support about a first axis parallel to the surface of a wafer received on said first wafer support and means for translating said first wafer support along a straight line, said straight line intercepting said first axis in any rotational position of said first wafer support about said first axis.

2. Apparatus as claimed in claim 1, in which said wafer handler further includes means for rotating said wafer support about a second axis perpendicular to the surface of the wafer.

3. Apparatus as claimed in claim 1 in which said means for rotating said wafer support and said means for translating said wafer support include motor drive means mounted outside said vacuum chamber.

4. Apparatus as claimed in claim 1 including a loading station; a loadlock station adjacent said loading station, said loadlock station defining an interface between said loading station and said vacuum chamber; means for transferring wafers from said loadlock station to said wafer handler comprising an arm mounted for rotation about a third, vertical axis and for translation along said third axis; first wafer receiving means formed on said arm; and first drive means operable to rotate said arm between a first position wherein said receiving means is in vertical alignment with said first wafer support and a second position wherein said wafer receiving means is within said loadlock.

5. Apparatus as claimed in claim 4 in which said loadlock station includes a second wafer support; said second wafer support and said first wafer support being disposed on a circle the center of which is said third axis; and said first wafer receiving means being positioned on said arm on a radius of said circle.

6. Apparatus as claimed in claim 5 in which said loadlock station comprises an upper loadlock element operable between a closed condition and an open condition wherein said loadlock station is open to atmosphere; and a lower loadlock element operable between a closed condition and an open condition wherein said loadlock station is open to said vacuum chamber, said lower loadlock element having said second wafer support thereon.

7. Apparatus as claimed in claim 1, including linear encoder means mounted on said wafer handle, a drive motor operatively connected to said wafer handle to effect said linear motion, dose measurement means mounted in said vacuum chamber in position to sense the dose of ions received by a wafer on said first wafer support, and motor controller means responsive to said dose measurement means and to the output of said linear encoder to control the speed of said linear motion.

8. In an end station for an ion implanter comprising a vacuum chamber; and a wafer handler within said vacuum chamber; the improvement wherein said wafer handler comprises a first arm rotatable about a first axis; a second arm mounted on a said first arm for relatively rotation therewith, a third arm mounted on said second arm for relative rotation therewith; a first wafer support mounted on said third arm; means for rotating said first, second and third arms as a unit about said first axis, said first axis being parallel to the surface of a wafer receiving on said first wafer support; means for rotating said first arm about said first axis; and means interconnecting said first, second and third arms operable to translate said wafer support along a straight line.

9. Apparatus as claimed in claim 8 wherein said means for rotating said first arm comprises a drive motor operatively connected to said first arm; said apparatus further including linear encoder means mounted on said wafer handler; dose measurement means mounted in said vacuum chamber in position to sense the dose of ions received by a wafer on said first wafer support; and motor controller means responsive to said dose measurement means and to the output of said linear encoder to control the speed of said drive motor; said linear encoder means comprising a first element mounted on said first arm, and a second element mounted on said third arm.

10. Apparatus as claimed in claim 9 in which said first element comprises an elongated scale member and said second element comprises a sensing element movable along said scale member and operable to produce a signal representative of the position of said sensing element along said scale.

* * * * *